US011251543B2

(12) United States Patent
Schnoerch et al.

(10) Patent No.: US 11,251,543 B2
(45) Date of Patent: Feb. 15, 2022

(54) ELECTRICAL CRIMP CONNECTOR WITH A SHIELD ELEMENT

(71) Applicant: AGC GLASS EUROPE, Louvain-la-Neuve (BE)

(72) Inventors: Peter Schnoerch, Brussels (BE); Csaba Morocz, Gosselies (BE)

(73) Assignee: AGC GLASS EUROPE, Louvain-la-Neuve (BE)

( * ) Notice: Subject to any disclaimer, the term of this patent is extended or adjusted under 35 U.S.C. 154(b) by 0 days.

(21) Appl. No.: 16/768,804

(22) PCT Filed: Dec. 4, 2018

(86) PCT No.: PCT/EP2018/083442
§ 371 (c)(1),
(2) Date: Jun. 1, 2020

(87) PCT Pub. No.: WO2019/110565
PCT Pub. Date: Jun. 13, 2019

(65) Prior Publication Data

US 2021/0184373 A1 Jun. 17, 2021

(30) Foreign Application Priority Data

Dec. 4, 2017 (EP) .................................... 17205209

(51) Int. Cl.
*H05K 1/00* (2006.01)
*H01R 4/02* (2006.01)
*H01R 4/18* (2006.01)

(52) U.S. Cl.
CPC ............... *H01R 4/028* (2013.01); *H01R 4/18* (2013.01)

(58) Field of Classification Search
CPC ........ H05B 3/84; H01C 7/027; H05K 1/0206; H01R 4/18; H01R 4/187
USPC .................................. 219/203, 553; 174/252
See application file for complete search history.

(56) References Cited

U.S. PATENT DOCUMENTS

2007/0224842 A1* 9/2007 Hoepfner ............ B23K 35/264 439/34
2015/0236431 A1 8/2015 Schmalbuch et al.
2015/0264800 A1 9/2015 Schmalbuch et al.
2015/0296569 A1 10/2015 Rateiczak et al.
2018/0048079 A1 2/2018 Schmalbuch et al.
2018/0220523 A1 8/2018 Schmalbuch et al.
2018/0330845 A1 11/2018 Reul et al.

FOREIGN PATENT DOCUMENTS

DE 20 2013 006 780 U1 10/2013
DE 20 2013 006 781 U1 10/2013
WO WO 2014/079595 A1 5/2014
WO WO 2016/096248 A1 6/2016

OTHER PUBLICATIONS

International Search Report dated Mar. 15, 2019 in PCT/EP2018/083442 filed on Dec. 4, 2018.

* cited by examiner

*Primary Examiner* — Phuong Chi Thi Nguyen
(74) *Attorney, Agent, or Firm* — Oblon, McClelland, Maier & Neustadt, L.L.P.

(57) ABSTRACT

A glazing panel comprising an electrical connector with a shield element to avoid a wicking effect, where the connector is an electrically conductive connector connected to an electrically conductive structure such as a heatable coating or an antenna. The glazing panel is particularly suitable for an automobile glazing.

12 Claims, 1 Drawing Sheet

ELECTRICAL CRIMP CONNECTOR WITH A SHIELD ELEMENT

TECHNICAL DOMAIN OF THE INVENTION

The present invention relates to glazing panel, which comprises an electrical connector. More particularly, the present invention relates to a vehicle glazing, which comprises electrically conductive connector connected to electrically conductive structure, for instance heat-able coating or antenna.

BACKGROUND OF THE INVENTION

Nowadays, more and more glazing panels are functional assemblies such as lighting, privacy, video, sound, heating functions, antennas and much more other functions.

These functional elements are deposited on the glazing panel as an electrically conductive structure. In this way, to work, to communicate, to be powered, . . . these electrically conductive structure needs to be linked to the outside of the glazing panel via a cable crimped with an electrical crimp connector soldered on the electrically conductive structure.

The cable is typically made of metal surrounded by a plastic film. To be crimped correctly and efficiently, the plastic film of the cable is removed only at the crimping region. The plastic film allows to protect the cable and to isolate it. The metal part is made of at least one metal fiber. Depending of the current passing through the cable and the quality of the cable, the metal part can be made of a plurality of fibers. This plurality of fibers can be twisted. The plastic part of the cable allows to maintain fibers together.

An electrical crimp connector is an element able to crimp at least a cable. A electrical crimp connector can be implemented as an open or closed crimp. In case of open crimp, the electrical crimp connector is provided as a small plate with wings pre-bent or not. These wings are folded or bent around the cable via crimp claws. In case of close crimp, the electrical crimp connector is configured as a tube or a sleeve. The electrical crimp connector is crimped around the previously introduced inside cable. For the two cases, the electrical crimp connector is deformed around the cable to ensure it.

The electrically conductive structure can be deposited on the substrate only on the part of the panel or on the whole surface and by a coating method such as magnetron sputtering, by printing, by gluing or any other methods suitable to deposit an electrically conductive structure to a glazing panel. The electrically conductive structure can be an antenna for TV, DTV, FM, AM, . . . and designed as a wire or a plate on the substrate for example. The electrically conductive structure can be a stack of coating layers with conductive and isolative layers or a Ag, Cu, or any other suitable metallic material or mixture able to be conductive and printed, glued, . . . on the substrate.

To solder the electrical crimp connector on the electrically conductive structure, a specific amount of soldering material is necessary. If the amount of soldering material is not enough, the electrical crimp connector is not well fixed and it can be removed. Even if the right amount is used, during the soldering of the electrical crimp connector on the electrically conductive structure, the soldering material could, by capillarity also named wicking effect, rise on the cable. Due to this effect, the cable is directly soldered on the electrically conductive structure. In case of handling the glazing panel, after the step of soldering, operators have to fold the cable on the glazing panel to be able to handle this panel without damaging the cable and the whole system.

During the folding step of the cable, the operator manipulates the cable and, when the cable is soldered directly on the electrically conductive structure, stresses are applied on the electrically conductive structure and on the substrate with risk of breakage, damage, chip removal, . . . The plastic part of the cable or the cable itself could also be damaged by the soldering material and the heat applied for the soldering.

The soldering material is any known soldering material and could be a lead-free soldering material to respect the End of live Vehicles Directives 2000/53/EC. The method of soldering can be any known soldering method for this soldering depending of material used for the substrate and any part soldered.

The following description relates to an automotive glazing panel but it is understood that the invention may be applicable to others fields like architectural glazing which may provide electrically functional component or an electrically functional layer.

The invention provides a solution to overcome these problems.

SUMMARY OF THE INVENTION

The invention relates to an improved glazing panel comprising at least a substrate with an electrically conductive structure; a shield element soldered by soldering material to the electrically conductive structure; an electrical crimp connector fixed on said shield element and an electrical cable crimped with the electrical crimp connector. The invention relates also to the use of an shield element to avoid the wicking effect comprising between a soldering material and a cable crimped with an electrically crimp connector. The invention relates also to a shield element to avoid the wicking effect comprising between a soldering material and a cable crimped with an electrically crimp connector comprising a shield element.

The invention relates also to the use of a shield element to avoid the wicking effect disposed between a soldering material and a cable crimped with an electrically crimp connector; the said shield element is soldered to an electrically conductive structure of a substrate.

The invention relates also to a shield element to avoid the wicking effect disposed between a soldering material and a cable crimped with an electrically crimp connector comprising a shield element.

The shield element protrudes from the said electrical crimp connector at least at the region of the output of the said cable from the said electrical crimp connector to avoid the wicking effect between the soldering material and the cable.

The substrate can be any substrate able to receive an electrically conductive structure on it. Preferably, the substrate is a glass substrate. The glass substrate can be processed, ie annealed, tempered, . . .

The electrically conductive structure is applied on at least one part of one surface of the substrate.

The electrically conductive structure can be a heat-able structure, an antenna or any other electrically conductive structure that need to be powered or linked with a cable. The glazing panel can comprises more than one electrically conductive structure.

The nature of the cable, ie the section, allows the received power. Dimensions of electrical crimp connector can depend of the dimension of the cable.

The electrically conductive structure can be deposited by sputtering, CVD, PECVD, . . . for coating layers for example or by printing for antenna structures. The material could be any conductive material able to be deposited on the glass surface; for instance, silver, copper or aluminum printed element, metal coating structure, silver, copper or aluminum foils, . . . .

The electrical crimp connector is an element that connects an electrical cable to the electrically conductive structure. The electrical crimp connector could be made of copper or brass, aluminum, steel and stainless steel alloys, Iron nickel alloys, Titanium or any kind of conductive metal. In case of stainless steel, steel, titanium or FeNi alloys. Preferably, the surface could be plated with solderable materials (like nickel or copper or silver, or the combination of those).

The electrical crimp connector is fixed directly on a shield element.

In one embodiment of the invention, the electrical crimp connector is soldered to the shield element. In another embodiment, the electrical crimp connector is welded to the shield element. The crimp connector is spot welded onto the shielding element. In another embodiment, the electrical crimp connector is ultrasonic welded onto the shielding element. In another embodiment, the electrical crimp connector fixed by at least one rivet to the shield element.

In another embodiment, the cable is directly fix on the shield element. In that embodiment, the electrical crimp connector is the fixing element. The cable can be welded or soldered on the shield element. Thus, in this embodiment, the welding or soldering material is understood as the electrical crimp connector.

It understood that the electrical crimp connector could also be a male/female connector or any electrical connector able to connect a cable to the electrically conductive structure with a solder material and a shielding element.

The cable is generally a metallic core with a plastic protective layer. The metallic core can be a single wire or a plurality of wires and typically made of Copper or Aluminum.

The shield element is positioned between the electrically crimp connector and the electrically conductive structure. The shield element is soldered by a soldering material on the electrically conductive structure. The shield element prevents the soldering material to raise the electrically crimp connector and/or the electrical cable. The shield element could be made of copper or brass, aluminum, steel and stainless steel alloys, Iron nickel alloys, Titanium or any kind of conductive metal. In case of stainless steel, steel, titanium or FeNi alloys. Preferably, the surface could be plated with solder able materials (like nickel or copper or silver, or the combination of those).

In another embodiment of the invention, The shield element and electrically crimp connector are made of the same material. The shield element and electrically crimp connector can be made in a single element to facilitate manipulations, to reduce cost, . . .

The soldering material solders the shield element to the electrically conductive structure. The soldering material can be made of lead alloys or lead-free alloys depending of the legislation and/or the thermal expansion needed between the shield element and the electrically conductive structure. In another embodiment, the soldering material could be replaced by a conductive adhesive or glue.

According to the present invention, the shield element is at least as large as the largest dimension of the electrical crimp connector. Dimensions of the shield element are measured on the surface slightly parallel to the surface of the said substrate where the electrically conductive structure is on. Preferably, the shield element is larger than the largest dimension of the electrical crimp connector to protect the cable fixed to the electrical crimp connector from the soldering material between the shield element and the electrically conductive structure.

The shape of the shield element is the shape of the surface slightly parallel to the surface of the said substrate where the electrically conductive structure is on.

More preferably, for manufacturing reasons, the shape of the shield element is an oval shape. In the case of an oval shape, the dimension, that has to be at least as large than the largest of the electrical crimp connector, is longest diameter of the oval shape. In the case of the smallest oval shape, the electrical crimp connector has to be fix in the direction of the longest diameter in order to protect the cable.

In a particular embodiment, the shape is a circular shape. This circular shape is particularly easy to manufacture and allows to fix an electrical crimp connector in any directions.

In another embodiment, the shield element has a rectangular shape. Preferably, the rectangular shape has angular edges as a polygon. preferably, in order to facilitate the soldering of the shield element on the electrically conductive structure, the rectangular shape has rounded edges.

In one embodiment, the shield element protrudes from the said electrical crimp connector at least at the region of the output of the cable from the electrical crimp connector for at least the diameter of the cable.

FIGURES

The present invention will now be more particularly described with reference to drawings and exemplary embodiments, which are provided by way of illustration and not of limitation. The drawings are a schematic representation and not true to scale. The drawings do not restrict the invention in any way. More advantages will be explained with examples.

Figure 1:
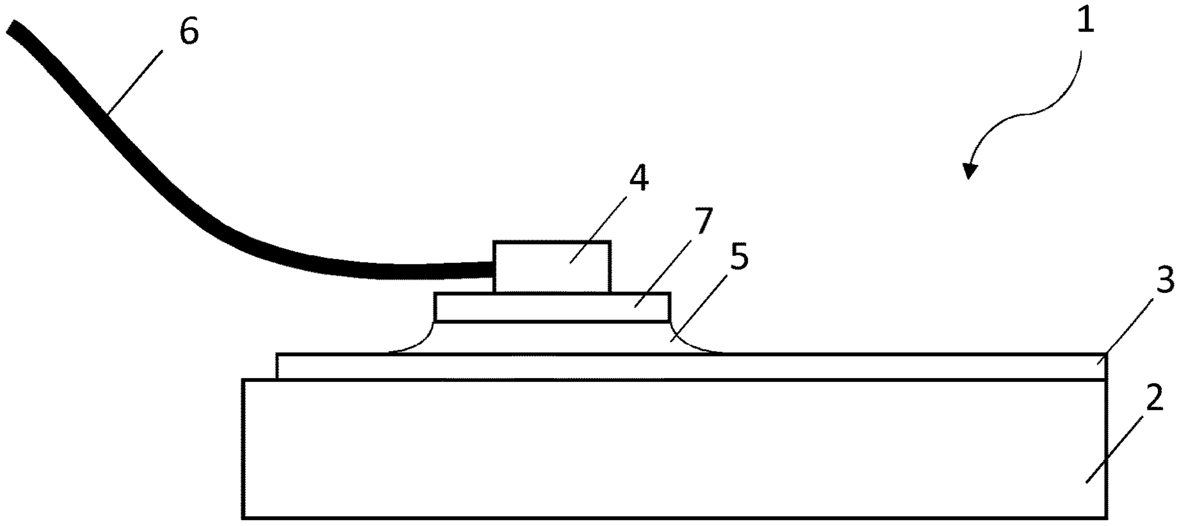
FIG. 1 is a side view of one embodiment of the glazing panel according to the invention.
Figure 2:
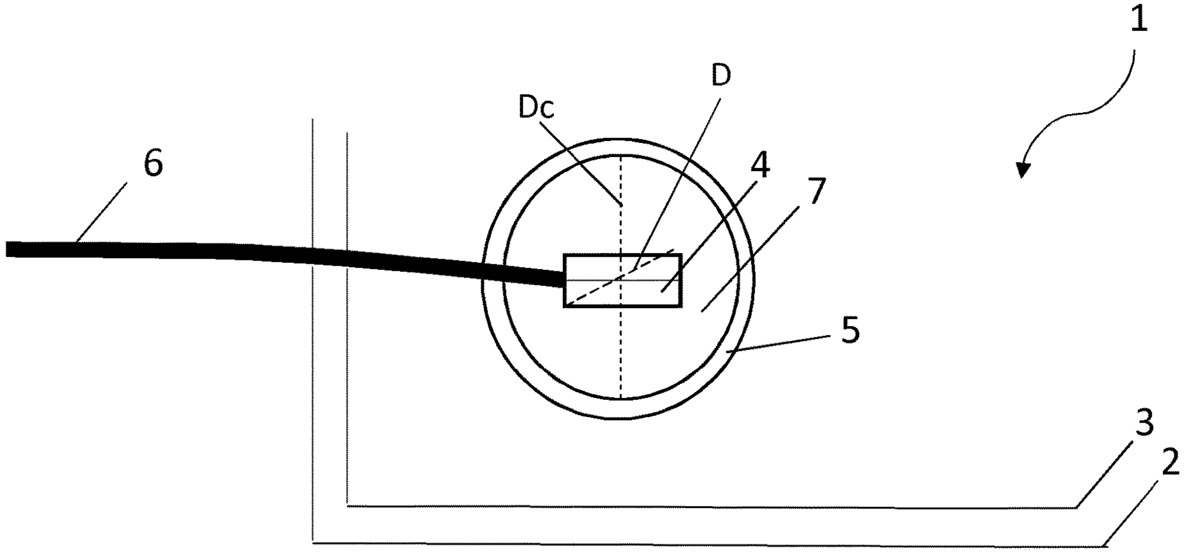
FIG. 2 is a plan view of one embodiment of the glazing panel according to the invention.

Referring to the FIG. 1 and FIG. 2, according to one embodiment of this invention, a glazing panel (1) comprises, a glass substrate (2) with an electrically conductive structure (3), a shield element (7) soldered by soldering material (5) to the electrically conductive structure (3); an electrical crimp connector (4) fixed on said shield element; an electrical cable (6) crimped with the electrical crimp connector. The shield element (7) has a circular shape and protrudes from the said electrical crimp connector (4) at least at the region of the output of the said cable from the said electrical crimp connector to avoid the wicking effect between the soldering material and the cable.

In this embodiment, the electrically conductive structure (3) is an antenna structure. The antenna is a silver layer printed on the surface of the glass substrate. In case of hidden antenna, antennas are printed in border of the glazing panel (1) and hidden by a black band. The black band can be deposited on the other surface of the glazing panel or between the glass substrate (2) and the electrically conductive structure (3). The black band can be a enamel frit deposited by silk printing.

In this embodiment, the electrical crimp connector (4) is a connector that crimps the metallic part of the cable made of Copper. The electrical crimp connector (4) looks slightly like a rectangular parallelepiped and is made of a conductive material such as Copper. The diagonal (D) of the surface slightly parallel to the surface of the glass substrate (2) of the electrical crimp connector (4) is the largest dimension.

In this embodiment, the shield element (7) is made of conductive material such as Copper. The surface parallel to the surface of the glass substrate (2) of shield element (7) has a circular shape with a diameter (Dc) larger than the diagonal (D) of the electrical crimp connector (4).

In that embodiment, the shield element (7) protrudes from the electrical crimp connector (4) in all direction and specially at the region of the output of the cable (6) from the electrical crimp connector (4) to avoid the wicking effect between the soldering material (5) and the cable (6).

The electrical crimp connector (4) is fixed on the shield element by soldering such as a high melting point alloy.

The dimension of electrically conductive crimp depends of the cable and thus the current passing through it. In one embodiment, for a low current application i.e. below 8 A, the diagonal D is about 5 mm, and Dc is at least 6 mm.

The dimension of shield element depends of electrically conductive crimp. In one embodiment, for a low current application i.e. below 8 A, the diagonal D is about 5 mm and Dc is at least 6 mm.

During the manufacturing and the handling of the glazing panel (1), the operator manipulates and folds the cable (6) in direction of the center of glazing panel (1). Due to the shield element, no soldering material, is in contact with the cable (6) thus the cable (6) can be manipulated without risk of breakage.

In another embodiment, the cable (6) is directly soldered on the shield element (7). The second soldering material is considered as the electrical crimp connector. The shield element (7) is larger than the area of the soldering of the cable (6). In this embodiment as for the other embodiments, the soldering material between the shield element (7) and the electrically conductive structure (3) cannot touch the cable (6) due to wicking effect, then risk of glass crack, chips or breakage are limited.

The invention claimed is:

1. A glazing panel comprising at least:

a substrate with an electrically conductive structure;

a shield element soldered by soldering material to the electrically conductive structure;

an electrical crimp connector fixed on said shield element;

an electrical cable crimped with the electrical crimp connector;

wherein said shield element protrudes from said electrical crimp connector at least at a region of said cable that connects to said electrical crimp connector to avoid a wicking effect between the soldering material and the cable.

2. The glazing panel according to claim 1, wherein the electrical crimp connector is soldered to the shield element.

3. The glazing panel according to claim 1, wherein the electrical crimp connector is fixed by at least one rivet to the shield element.

4. The glazing panel according to claim 1, wherein the shield element has an oval shape.

5. The glazing panel according claim 1, wherein the shield element has a circular shape.

6. The glazing panel according claim 1, wherein a longest dimension of the shield element is at least 10% larger than a longest dimension of the electrical crimp connector.

7. The glazing panel according to claim 1, wherein said shield element protrudes from said electrical crimp connector at least at the region of said cable that connects to said electrical crimp connector for at least a diameter of the cable.

8. The glazing panel according to claim 1, wherein said substrate is a glass substrate.

9. The glazing panel according to claim 1, wherein the electrical crimp connector is welded to the shield element.

10. The glazing panel according to claim 9, wherein the electrical crimp connector and the shield element are made of a same material.

11. A method of, joining a shield element to a substrate to avoid a wicking effect, comprising:

disposing the shield element between a soldering material and a cable crimped with an electrical crimp connector; and soldering the shield element to an electrically conductive structure of the substrate, wherein the shield element protrudes from the electrical crimp connector at least at a region of the cable that connects to said electrical crimp connector to avoid the wicking effect on the cable.

12. A shield element to avoid a wicking effect, the shield element disposed between a soldering material and a cable crimped with an electrical crimp connector comprising:

a shield element, wherein the shield element is soldered to an electrically conductive structure of a substrate, and wherein the shield element protrudes from the electrical crimp connector at least at a region of the cable that connects to the electrical crimp connector to avoid the wicking effect on the cable.

* * * * *